(12) United States Patent
Saito

(10) Patent No.: US 12,471,335 B2
(45) Date of Patent: Nov. 11, 2025

(54) SILICON CARBIDE SEMICONDUCTOR DEVICE INCLUDING SEMICONDUCTOR ELEMENT HAVING GATE-TRENCH STRUCTURE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Jun Saito, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 529 days.

(21) Appl. No.: 17/949,294

(22) Filed: Sep. 21, 2022

(65) Prior Publication Data
US 2023/0107762 A1    Apr. 6, 2023

(30) Foreign Application Priority Data
Oct. 5, 2021    (JP) .................. 2021-164344

(51) Int. Cl.
*H10D 62/832* (2025.01)
*H10D 30/66* (2025.01)
*H10D 62/17* (2025.01)

(52) U.S. Cl.
CPC ....... *H10D 62/8325* (2025.01); *H10D 30/668* (2025.01); *H10D 62/393* (2025.01)

(58) Field of Classification Search
CPC . H10D 62/8325; H10D 30/668; H10D 62/393
See application file for complete search history.

(56) References Cited

U.S. PATENT DOCUMENTS

| | | | | |
|---|---|---|---|---|
| 2002/0132473 | A1* | 9/2002 | Chiang | H01L 21/76843 438/643 |
| 2012/0199901 | A1* | 8/2012 | Nagata | H01L 21/265 257/330 |

(Continued)

OTHER PUBLICATIONS

Sidwha et al., "Study of the Step Coverage and Contact Resistance by Using Two-Step TiN Barrier and Evolve Simulation", IEEE transactions on semiconductor manufacturing, vol. 18, No. 1, Feb. 2005, pp. 163-173, ISSN 0894-6507, DOI: 10.1109/TSM.2004. 840524.

*Primary Examiner* — Norman D Richards
*Assistant Examiner* — Sean Ayers Winters
(74) *Attorney, Agent, or Firm* — POSZ LAW GROUP, PLC

(57) ABSTRACT

A silicon carbide semiconductor device includes a semiconductor element having a first-conductivity-type region, a gate-trench structure, an interlayer insulation film, a first electrode, and a recess. The gate-trench structure has a gate trench. The first electrode includes a metal layer, a barrier metal, an electrode layer, and a protrusion. The protrusion has a first protruding portion and a second protruding portion disposed respectively at both sides of the gate trench. The electrode layer has a portion embedded in the recess. A distance between a tip of the first protruding portion and a tip of the second protruding portion in a width direction of the gate-trench is smaller than a width of the portion of the electrode layer below the protrusion.

17 Claims, 14 Drawing Sheets

(56) References Cited

U.S. PATENT DOCUMENTS

| | | | |
|---|---|---|---|
| 2015/0155362 A1* | 6/2015 | Nakazawa | H01L 29/78648 |
| | | | 257/43 |
| 2018/0358445 A1 | 12/2018 | Kobayashi et al. | |
| 2020/0091299 A1* | 3/2020 | Nakamata | H01L 21/02458 |
| 2020/0219980 A1* | 7/2020 | Shimizu | H01L 29/518 |
| 2020/0295182 A1* | 9/2020 | Hoshi | H01L 29/7815 |
| 2020/0303506 A1* | 9/2020 | Kiyosawa | H01L 27/088 |
| 2020/0395456 A1* | 12/2020 | Hoshi | H01L 29/0623 |
| 2021/0167173 A1* | 6/2021 | Fujimoto | H01L 21/046 |
| 2021/0384298 A1* | 12/2021 | Hoshi | H01L 29/7803 |
| 2022/0130995 A1* | 4/2022 | Lichtenwalner | H01L 29/7397 |

\* cited by examiner

CELL REGION          GATE WIRING PORTION

CELL REGION          GATE WIRING PORTION

SILICON CARBIDE SEMICONDUCTOR DEVICE INCLUDING SEMICONDUCTOR ELEMENT HAVING GATE-TRENCH STRUCTURE

CROSS REFERENCE TO RELATED APPLICATIONS

This application is based on Japanese Patent Application No. 2021-164344 filed on Oct. 5, 2021, the disclosure of which is incorporated herein by reference.

TECHNICAL FIELD

The present disclosure relates to a silicon carbide (SiC) semiconductor device.

BACKGROUND

A SiC semiconductor device may have a semiconductor element with a trench-gate structure made of silicon carbide.

SUMMARY

The present disclosure describes a SiC semiconductor device including a semiconductor element having a first-conductivity-type region, a gate-trench structure, an interlayer insulation film, a first electrode, and a recess.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
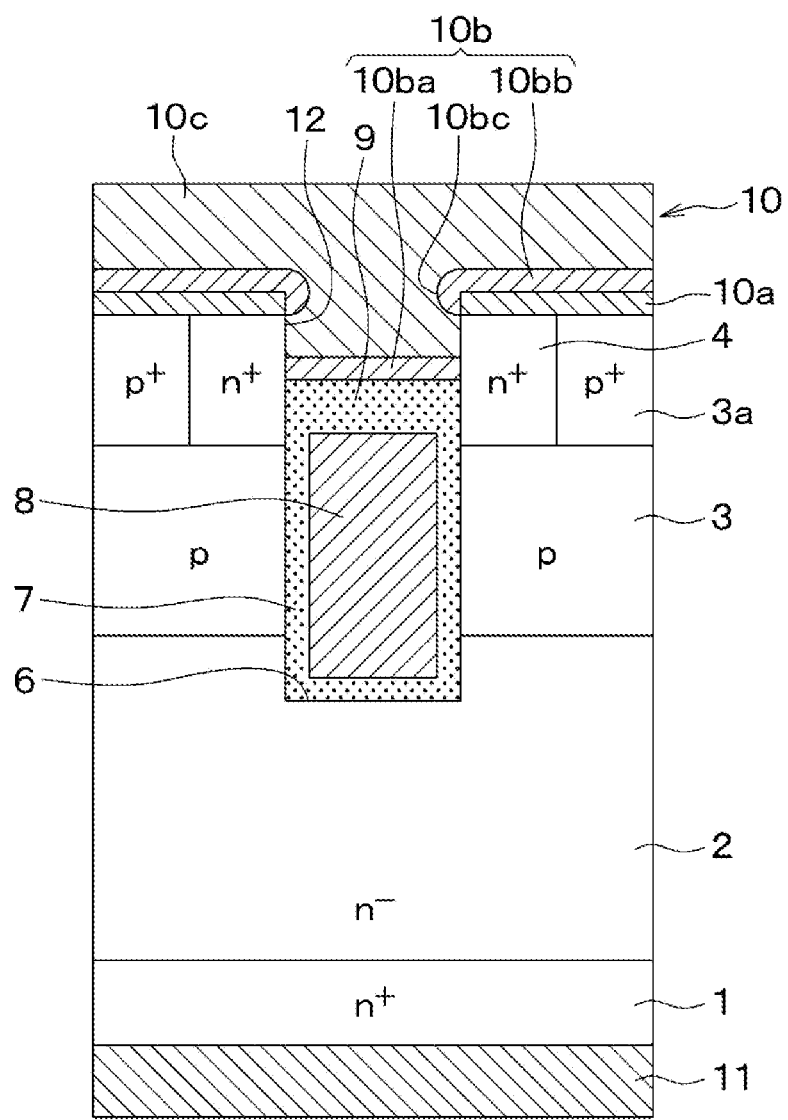
FIG. 1 is a cross-sectional view of a SiC semiconductor device according to a first embodiment.

A SiC semiconductor device may have a trench-gate structure that reduces a cell pitch without increasing an on-resistance. In this SiC semiconductor device, an interlayer insulation film and a barrier metal are embedded on a gate electrode inside the gate trench to flatten a surface, and a source electrode having a barrier metal and an electrode layer is formed by forming the electrode layer on the surface. With such a structure, since it is not required to expose the interlayer insulation film to the top surface of the SiC, it is possible to form a contact at the entire top surface and have less constraints of a cell pitch due to misalignment of a mask at the formation of the contact hole. Thereby, it is possible to further reduce the cell pitch.

When a semiconductor element such as a metal-oxide-semiconductor field-effect transistor (MOSFET) included in the SiC semiconductor device is operated, the temperature may repeatedly rise and drop. Since different types of constituent material included in the semiconductor element respectively have different linear expansion coefficients, a stress is repeatedly applied to the interface between the constituent materials due to a rise and a drop in the temperature. Therefore, if the MOSFET has the trench-gate structure, the source electrode may be peeled off.

As in the SiC semiconductor device described above, in a situation where the surface on the gate electrode inside the gate-trench structure with the embedded interlayer insulation film and the embedded barrier metal is flattened; and the electrode layer is formed on the surface, the anchor effect may be reduced due to smaller roughness of the surface. In other words, if the surface has roughness, the misalignment between electrode layer and its underlying layer in a lateral direction is suppressed by unevenness due to the roughness. However, if the surface has smaller roughness, the misalignment between the electrode layer and its underlying layer in the lateral direction may occur, and thus the source electrode may be peeled off.

When the source electrode is peeled off, the resistance increases when the current is applied. Therefore, a temperature rise due to heat generation occurs and the element may have a breakdown.

According to an aspect of the present disclosure, a SiC semiconductor includes a semiconductor element having a substrate, a drift layer, a channel layer, a first-conductivity-type region, a gate-trench structure, an interlayer insulation film, a first electrode, a second electrode and a recess. The substrate is made of silicon carbide, and is first conductivity type or second conductivity type. The drift layer is the first conductivity type and disposed on the substrate, and the drift layer has lower impurity concentration than the substrate. The channel layer is the second conductivity type and disposed on the drift layer, and the channel layer has a surface layer portion at which a contact region is disposed. The first-conductivity-type region is the first conductivity type and has higher impurity concentration than the drift layer. The first-conductivity-type region is disposed at a position different from the contact region on the channel layer. The gate-trench structure has a gate trench, a gate insulation film, and a gate electrode. The gate trench penetrates the first-conductivity-type region and the channel layer. The gate insulation film is disposed at an inner wall surface of the gate trench. The gate electrode is disposed on the gate insulation film. The interlayer insulation film covers the gate electrode inside the gate trench. The first electrode is electrically connected to the contact region and the first-conductivity-type region. The second electrode is disposed at a side closer to a rear surface of the substrate. The recess is provided by a step between a top surface of the interlayer insulation film and a top surface of the first-conductivity-type region. The first electrode includes a metal layer, a barrier metal and an electrode layer. The metal layer is disposed on a surface of each of the contact region and the first-conductivity-type region. The barrier metal is disposed on the metal layer and inside the recess. The electrode layer is disposed on the barrier metal layer. The barrier metal includes a first barrier metal portion and a second barrier metal portion. The first barrier metal portion is disposed inside the recess. The second barrier metal portion is disposed on the metal layer. A step is disposed between the first barrier metal portion and the second barrier metal portion. The first electrode further includes a protrusion disposed at the second barrier metal portion and protruding toward inside of the gate trench in a width direction of the gate trench. The protrusion has a first protruding portion and a second protruding portion disposed respectively at both sides of the gate trench in the width direction. The electrode layer has a portion embedded in the recess below the protrusion. A distance between a tip of the first protruding portion and a tip of the second protruding portion in the width direction of the gate trench is smaller than a width of the portion of the electrode layer below the protrusion in the width direction of the gate trench.

According to the above structure, the step is formed between the first barrier metal portion and the second barrier metal portion. That is, the surface of the base of the electrode layer has surface roughness. The second barrier metal portion includes the protrusion protruding in an eaves shape towards inside of the gate trench in the width direction. The distance between the tip of the first protruding portion and the tip of the second protruding portion respectively at both sides of the gate trench is smaller than the width of the portion of the electrode layer embedded in the recess below the protrusion. Therefore, the electrode layer can exhibit an anchor effect. Even if the temperature repeatedly rises and falls when the semiconductor element is operated, the electrode layer is less likely to be peeled off from the underlying barrier metal. Thus, it is possible to inhibit the peeling of the source electrode. It is possible to suppress an increase in the temperature caused by an increase in the resistance at the time of applying the current and heat generation, and it is possible to inhibit the breakdown of the element.

The following describes several embodiments of the present disclosure with reference to the drawings. In the following embodiments, the same or equivalent parts are denoted by the same reference numerals.

First Embodiment

The following describes a first embodiment. The following describes a SiC semiconductor device according to the first embodiment. The present embodiment describes an example in which the SiC semiconductor device is formed with a MOSFET as a semiconductor element with a trench-gate structure.

The SiC semiconductor device according to the present embodiment includes a vertical MOSFET having the trench-gate structure as illustrated in FIG. 1. The vertical MOSFET is formed in a cell region of the SiC semiconductor device, and the SiC semiconductor device is made by forming an outer peripheral high breakdown-voltage structures so as to surround the cell region, but only the vertical MOSFET is shown in the drawings. In the following description, a horizontal direction in FIG. 1 is taken as a width direction of the SiC semiconductor device, and a vertical direction is taken as a thickness direction or a depth direction of the SiC semiconductor device.

Figure 2:
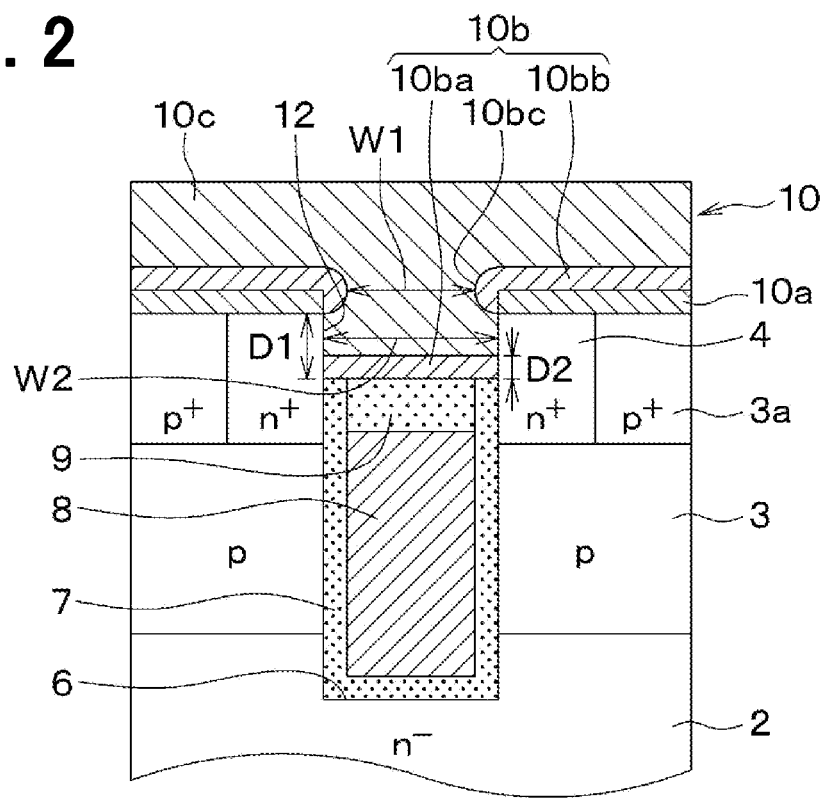
FIG. 2 is a cross-sectional view showing a structure of a source electrode.

In the SiC semiconductor device, an $n^+$-type substrate 1 made of SiC is used as a semiconductor substrate. As shown in FIG. 2, the SiC semiconductor device is formed using an $n^+$-type substrate 1 made of SiC. On the main surface of the $n^+$-type substrate 1, an $n^-$-type drift layer 2, a p-type base region 3, and an $n^+$-type source region 4 are made of SiC and are sequentially epitaxially grown.

The p-type base region 3 is a portion formed with a channel region. The p-type base region 3 is formed with a p-type contact region 3a in which the p-type impurity concentration is partially increased in a surface layer portion at a position different from the location where the $n^+$-type source region 4 is arranged. The $n^+$-type source region 4 has higher impurity concentration than the $n^-$-type drift layer 2. The p-type base region 3 may also be referred to as a channel layer. The $n^+$-type source region 4 may also be referred to as a first-conductivity-type region.

In addition, a gate trench 6 is formed to penetrate the p-type base region 3 and the $n^+$-type source region 4 and to reach the $n^-$-type drift layer 2. The p-type base region 3 and the $n^+$-type source region 4 are disposed so as to be in contact with side surfaces of the gate trenches 6. The gate trench 6 is provided in a linear layout with a lateral direction of FIG. 1 as a widthwise direction or a width direction, a direction normal to the drawing of FIG. 1 as a lengthwise direction or a length direction, and a direction perpendicular to the widthwise direction and the lengthwise direction as a depth direction. Although only one gate trench 6 is shown in FIG. 1 multiple gate trenches 6 are disposed at a regular interval in the lateral direction of FIG. 2. Although the width of the gate trench 6 is arbitrary, the width of the gate trench 6 may be twice or larger of the thickness of a barrier metal 10b, and is in a range of 0.3 to 1 micrometer (μm). For example, the width of the gate trench 6 is set to 1 μm.

A portion of the p-type base region 3 located on a side surface of the gate trench 6 is a channel region that connects the $n^+$-type source region 4 and the $n^-$-type drift layer 2 when the vertical MOSFET is operated. A gate insulation film 7 is formed on an inner wall surface of the gate trench 6 including the channel region. The surface of the gate insulation film 7 is formed with a gate electrode 8 made of polysilicon. The gate electrode 8 is n-type doped or p-type doped. An interlayer insulation film 9 is formed on the gate insulation film 7 and the gate electrode 8 to form a trench-gate structure. The gate trench 6 is not completely filled by the gate insulation film 7, the gate electrode 8 and the interlayer insulation film, and is filled with a part of a barrier metal 10ba and an electrode layer 10c described hereinafter as illustrated in FIG. 2.

The top surface of the gate electrode 8 is lower than the top surface of the n+-type source region 4 included in the entrance of the gate trench 6, and a step is formed between the top surface of the gate electrode 8 and the top surface of the n+-type source region 4 so that the gate electrode 8 is formed in a recessed shape. The interlayer insulation film 9, a portion of the barrier metal 10ba and a portion of the electrode layer 10c are arranged in the recessed shape to fill the step so as to fill the gate trench 6. Even after the interlayer insulation film 9 is formed on the gate electrode 8, the recessed shape remains, and a recess 12 with a depth in a range of 40 to 300 nanometers (nm), for example, around 200 nm is formed. Therefore, a portion of the barrier metal 10ba and a portion of the electrode layer 10c are formed to be filled in the recess 12 included in the recessed shape. In other words, the bottom surface of the barrier metal 10ba is located below the SiC surface made of the n+-type source region 4 and the p-type contact region 3a. The barrier metal 10ba is formed to fill the recess 12, and the top surface of the barrier metal 10ba is located below the SiC surface. Subsequently, a portion of the barrier metal 10ba and a portion of the electrode layer 10c are embedded in the recess 12.

Further, on the interlayer insulating film 9, for example, a source electrode 10 and a gate wiring layer (not shown) are formed. The source electrode 10 corresponds to a first electrode. The source electrode 10 is in contact with the n+-type source region 4 and the p-type contact region 3a through the contact hole of the interlayer insulation film 9. The gate wiring portion is in contact with the gate electrode 8 in a cross section different from a cross section shown in FIG. 1.

As illustrated in FIG. 2, the source electrode 10 includes a metal silicide layer 10a, the barrier metal 10b and the electrode layer 10c.

The metal silicide layer 10a is an ohmic contact layer that undergoes a silicidation reaction with SiC. With the formation of the metal silicide layer 10a, an ohmic contact with a lower contact resistance is formed between the source electrode 10 and the SiC. The metal silicide layer 10a is made of silicide being a high melting metal such as nickel (Ni), silicide, titanium (Ti) silicide, tantalum (Ta) silicide, tungsten (W) silicide and molybdenum (Mo) or a noble metal. The metal included in the metal silicide layer 10a may be in a single type, or may be in multiple types. For example, the types of metal included in the metal silicide layer 10a may be different between the n-type SiC and the p-type SiC. For example, in the present embodiment, the metal silicide layer 10a is made of Ni silicide. Although the thickness of the metal silicide layer 10a is arbitrary, the thickness is set in a range of 10 to 100 nm, for example, about 50 nm.

Figure 3:
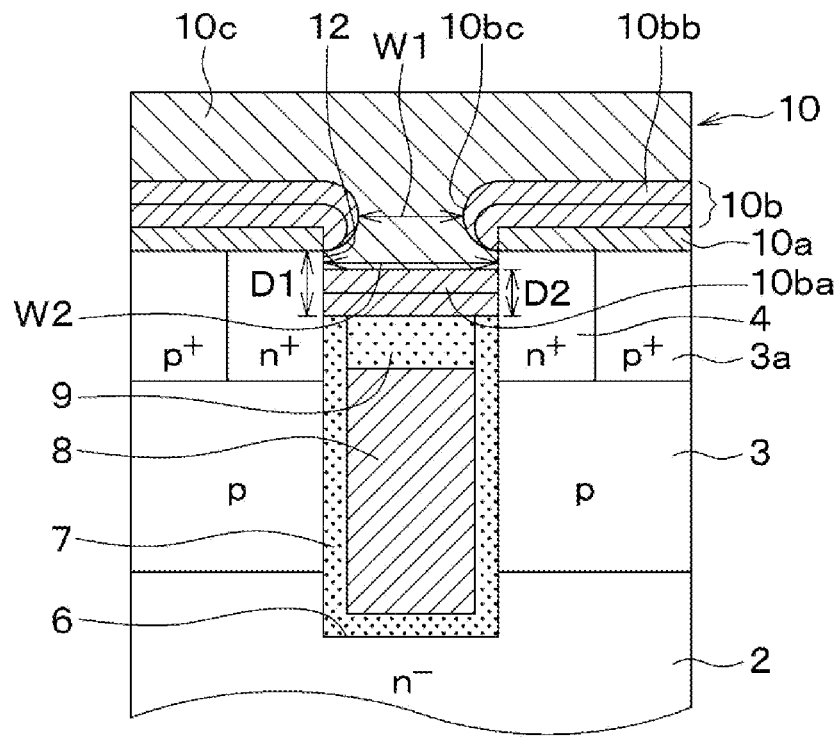
FIG. 3 is a cross-sectional view of the structure of the source electrode in a situation where a barrier metal is made of a stacking structure.

The barrier metal 10b includes a barrier metal 10ba formed on the interlayer insulation film 9 and a barrier metal 10bb formed on the metal silicide layer 10a. The barrier metal 10ba corresponds to a first barrier metal or a first barrier metal portion, and the barrier metal 10bb corresponds to a second barrier metal or a second barrier metal portion. The barrier metal 10ba suppresses, for example, the diffusion of a metal element to the interlayer insulation film 9 and the gate electrode 8 from a side closer to the source electrode 10. The barrier metal 10bb suppresses, for example, the diffusion of the metal element to the electrode layer 10c from the metal silicide layer 10a in the source electrode 10. When the metal silicide layer 10a is made of Ni silicide, the barrier metal 10ba suppresses the diffusion of Ni to the interlayer insulation film 9 and the gate electrode 8, and the barrier metal 10bb suppresses the diffusion of Ni to the electrode layer 10c. The barrier metal 10b is made of a metal that fulfills the above functions, such as titanium (Ti) or titanium nitride (TiN). Although FIG. 2 illustrates that the barrier metal 10b is made of a single-layer structure, the barrier metal 10b may also be made of a stacking structure with multiple metals such as Ti and TiN as illustrated in FIG. 3. The stacking structure may also be referred to as a laminated structure.

Although the barrier metal 10ba and the barrier metal 10bb are formed at the same time, they are not formed at the same plane. A step is formed between the barrier metal 10ba and the barrier metal 10bb so that the top surface of the barrier is positioned above the top surface of the barrier metal 10ba. Moreover, the barrier metal 10ba and the barrier metal 10bb are separated from each other. Although the thickness of the barrier metal 10b is arbitrary, the thickness is less than or equal to the depth of the recess 12. In a situation where the barrier metal 10b is made of a stacking structure with Ti and TiN, Ti has a thickness in a range of 30 to 100 nm, for example, 50 nm; and TiN has a thickness in a range of 50 to 100 nm, for example, 100 nm.

Since the thickness of the barrier metal 10b is smaller than or equal to the depth of the recess 12, the barrier metal 10ba is located below the SiC surface, and a hollow place of the recess 12 remains even though the barrier metal 10ba is arranged. In other words, the magnitude of the depth D1 of the recess 12 is larger than the magnitude of the thickness D2 of the barrier metal 10ba. For this reason, when the roughness is present at the SiC surface, the electrode layer 10c is formed, and a portion of the electrode layer 10c is embedded in the recess 12. In the present embodiment, SiC is exposed at a top end position at a side closer to the side surface of the gate trench 6, and a portion of the electrode layer 10c is in contact with SiC.

The barrier metal 10bb has a protruding portion 10bc protruding toward inside of the gate trench 6 from the metal silicide layer 10a in the width direction of the gate trench 6. The dimension of a distance W1 between adjacent tips of the protruding portion 10bc at both sides of the gate trench 6 in the width direction is smaller than the dimension of a width W2 of a portion of the electrode layer 10c embedded below the protruding portion 10bc. The protruding amount of the protruding portion 10bc may be adjusted based on the condition for film formation of the barrier metal 10b. The protruding portion 10bc can be protruded to a level identical to the thickness of a portion of the barrier metal 10b formed on the metal silicide layer 10a. In this embodiment, the protruding level of the protruding portion 10bc is set to a half or more of the thickness of a portion of the barrier metal 10b formed on the metal silicide layer 10a. The protruding portion 10bc may also be simply referred to as a protrusion, and the protrusion has a first protruding portion and a second protruding portion respectively at both sides of the gate trench 6. In other words, the dimension of the distance W1 between the tip of the first protruding portion and the tip of the second protruding portion in the width direction is smaller than the dimension of the width W2 of the portion of the electrode layer 10c embedded below the protruding portion 10bc.

The electrode layer 10c is a portion included in a pad portion of the source electrode 10. The electrode layer 10c is made of a metal including aluminum (Al) such as aluminum silicon (AlSi). The electrode layer 10c is formed to be thicker than the metal silicide layer 10a and the barrier metal 10b. The electrode layer 10c is embedded the gate trench 6 including a portion below the protruding portion 10bc through the gap with the dimension W1. Thus, it is possible to exhibit an anchor effect as the electrode layer 10c is embedded in the portion below the protruding portion 10bc.

The present embodiment describes the electrode layer 10c is made of a single-layer structure. However, the electrode layer 10c may be made of a stacking structure by plating the surface with nickel (Ni) or gold (Au).

Further, a drain electrode 11 corresponding to a second electrode electrically connected to the $n^+$-type substrate 1 is formed on a back surface of the $n^+$-type substrate 1. With such a structure, the vertical MOSFET of an n-channel inverted type trench-gate structure is provided. A cell region is formed by placing the vertical MOSFET cells described above. The SiC semiconductor device is provided by forming the outer peripheral voltage withstand structure such as a guard ring (not shown) or the like to surround the cell region in which such vertical MOSFETs are formed.

Figure 4:
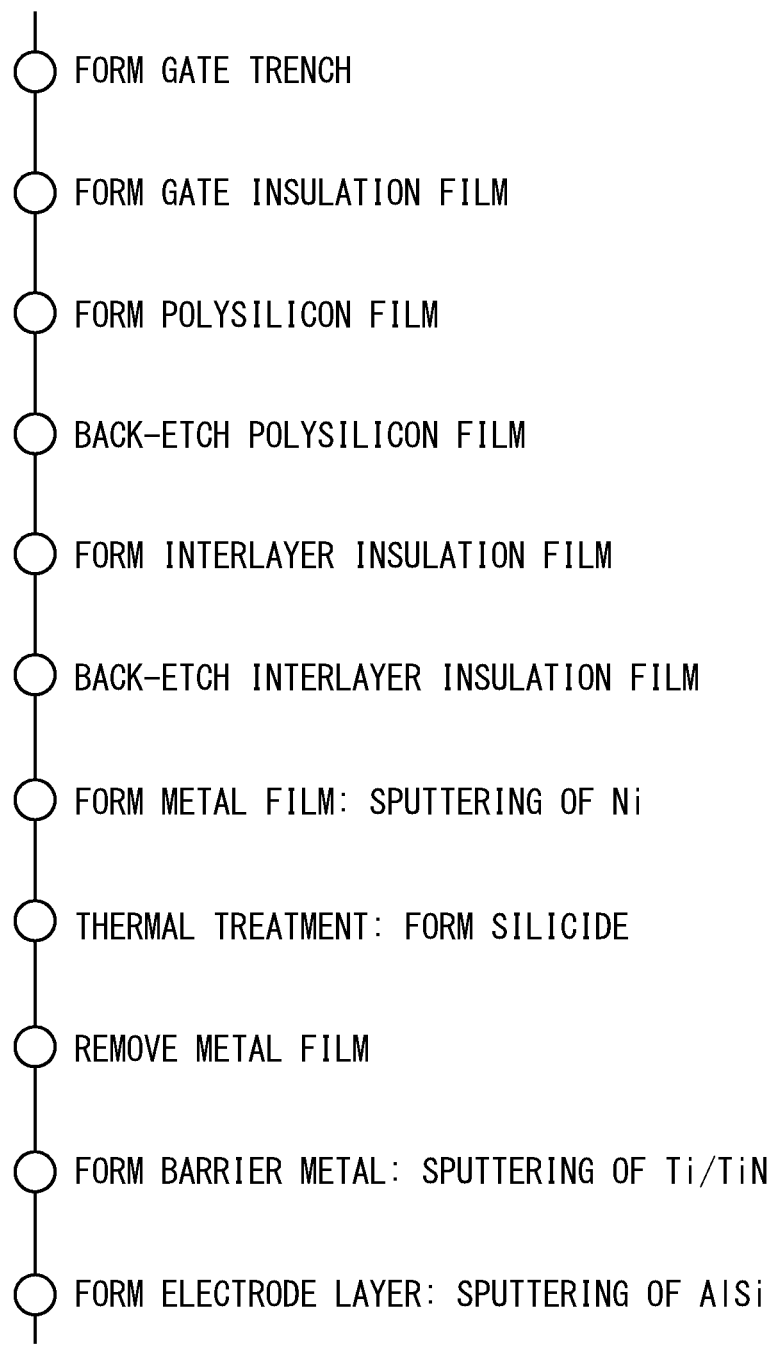
FIG. 4 is a flowchart that illustrates formation of a trench-gate structure and the source electrode in the SiC semiconductor device according to the first embodiment.

The following describes a method for manufacturing the SiC semiconductor device according to the present embodiment with reference to the flowchart in FIG. 4 and cross-sectional views in respective FIGS. 5A to 5H during the manufacturing. Since the devices other than the gate electrode 8 may be formed in an arbitrary method, the following mainly describes the method for forming the gate electrode 8.

First, an $n^+$-type substrate 1 made of SiC and formed in a wafer shape is prepared, and then an $n^-$-type drift layer 2 is epitaxially grown on the main surface of the $n^+$-type substrate 1. A p-type base region 3 and an $n^+$-type source region 4 are formed on the $n^-$-type drift layer 2 by epitaxial growth or ion implantation. A mask (not shown) is formed on the main surface of the $n^+$-type source region 4, and the p-type contact region 3a is formed through ion-implantation of p-type impurities. Next, the mask (not shown) is disposed on the surfaces of the p-type base region 3 and the $n^+$-type source region 4, and a portion of the mask where the trench-gate structure is to be formed with an aperture. The aperture corresponds to an opening.

Subsequently, the gate trench 6 is formed as illustrated in FIG. 4. For example, anisotropic etching such as reactive ion etching (RIE) is performed using the mask to form the gate trench 6 as in FIG. 5A. After the mask is removed, the gate insulation film 7 is formed as illustrated in FIG. 4. For example, a silicon oxide film is formed by chemical vapor deposition (CVD), and a thermal oxide film is formed by thermal oxidation. Therefore, the gate insulation film 7 is formed.

Figure 5A:
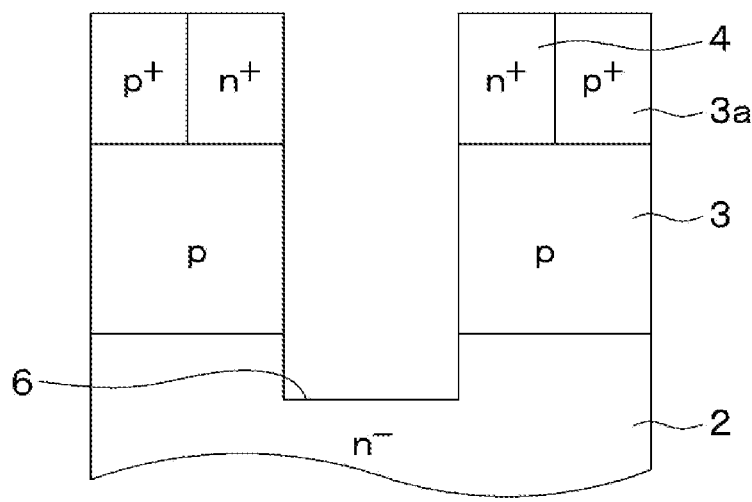
FIG. 5A is a cross-sectional view that illustrates a state after forming a gate trench in FIG. 4.
Figure 5B:
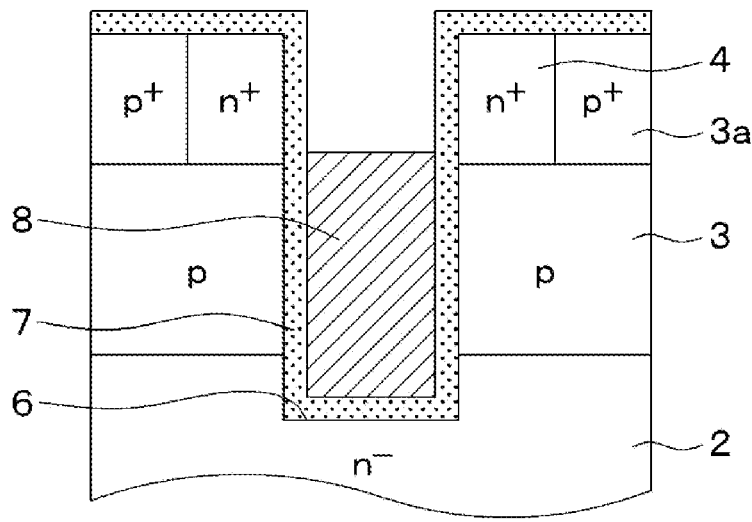
FIG. 5B is a cross-sectional view that illustrates a state after back-etching in FIG. 4.

Subsequently, the formation of the polysilicon and the back-etching treatment are performed as illustrated in FIG. 4 to form the gate electrode 8 inside the gate trench 6 as illustrated in FIG. 5B. In other words, after the polysilicon film is formed at the surface of the gate insulation film 7 to fill the gate trench 6 inside by, for example, the CVD, the polysilicon is back-etched by dry etching to remove a portion formed outside the gate trench 6. At this time, the polysilicon is back-etched until the interior of the gate trench 6 is recessed so that the interior of the gate trench 6 is not completely filled with the gate electrode 8.

Figure 5C:
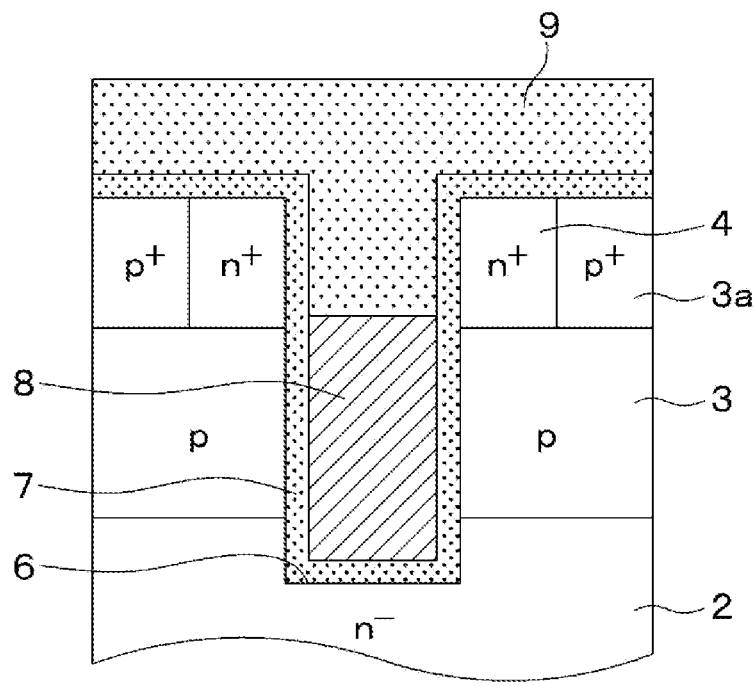
FIG. 5C is a cross-sectional view that illustrates a state after forming an interlayer insulation film in FIG. 4.
Figure 5D:
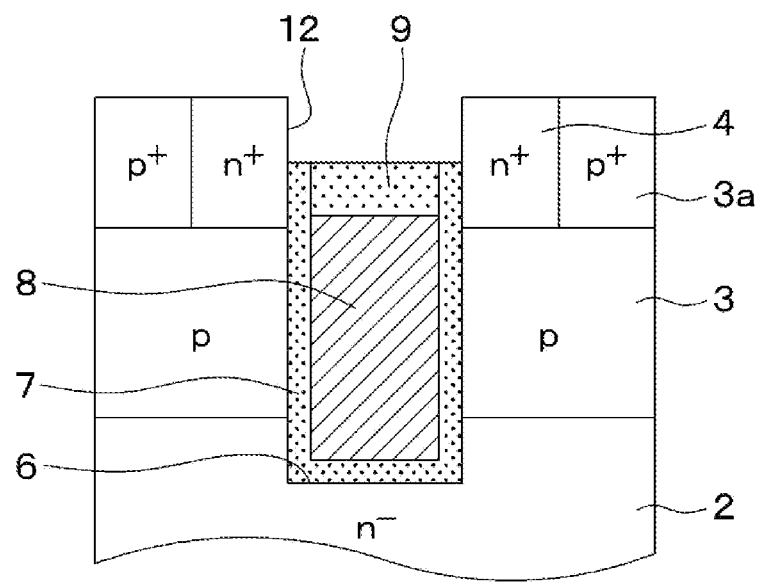
FIG. 5D is a cross-sectional view that illustrates a state after back-etching of the interlayer insulation film in FIG. 4.
Figure 5E:
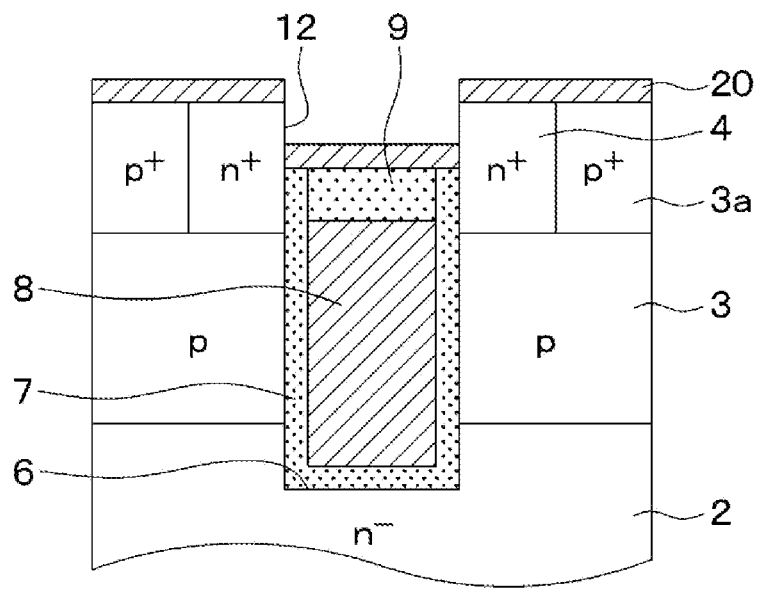
FIG. 5E is a cross-sectional view that illustrates a state after forming a metal film in FIG. 4.

Subsequently, as the formation of the interlayer insulation film 9 is performed as illustrated in FIG. 4, the interlayer insulation film 9 is formed on the gate electrode 8 to fill the interior of the gate trench 6 as in FIG. 5C. For example, the interlayer insulation film 9 can be formed by, for example, low-pressure CVD. The back-etching of the interlayer insulation film 9 shown in FIG. 4 is performed. As in FIG. 5D, the interlayer insulation film 9 is exposed by, for example, dry etching to expose the SiC surface while leaving the interlayer insulation film 9 on the gate electrode 8, while the interlayer insulation film 9 is back-etched by, for example, dry etching to form a recess shape of the recess 12. Although the depth of the recess 12 is arbitrary, for example, the depth of the recess 12 is, for example, about 200 nm.

Subsequently, the formation of the metal film and the formation of the silicide through thermal treatment are performed as in FIG. 4. As in FIG. 5E, a metal film 20 for forming a metal silicide layer 10a is formed. The Ni film is formed by the sputtering of Ni. At this time, since the recess 12 remains inside the gate trench 6, when the metal film 20 is formed, a step is formed at the metal film 20 between a location on the gate trench and outside the gate trench 6.

Thermal treatment is performed in a range of 600 to 800 degrees Celsius, for example, 700 degrees Celsius to cause a silicidation reaction between the metal included in the metal film 20 and Si inside SiC. As a result, the metal film 20 undergoes the silicidation reaction on the SiC surface, and the metal film 20 on the interlayer insulation film 9 remains without the silicidation reaction.

Figure 5F:
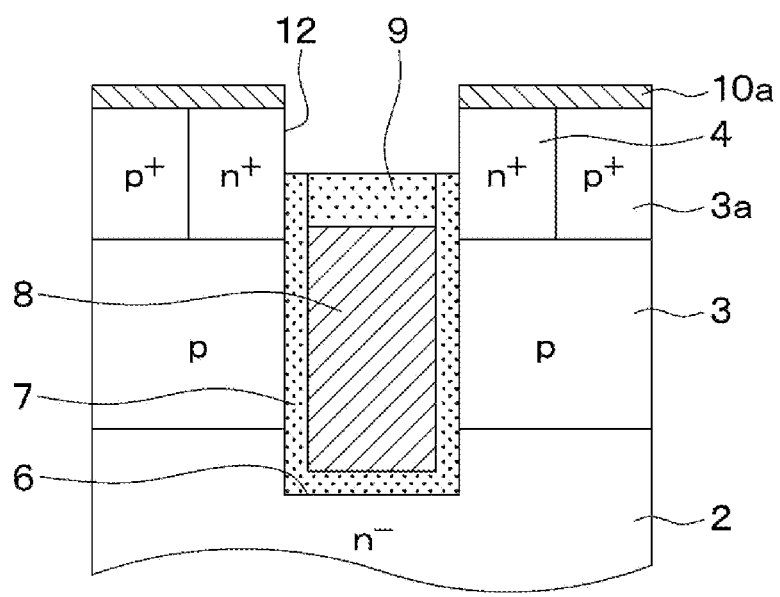
FIG. 5F is a cross-sectional view that illustrates a state after removing a metal film in FIG. 4.
Figure 5G:
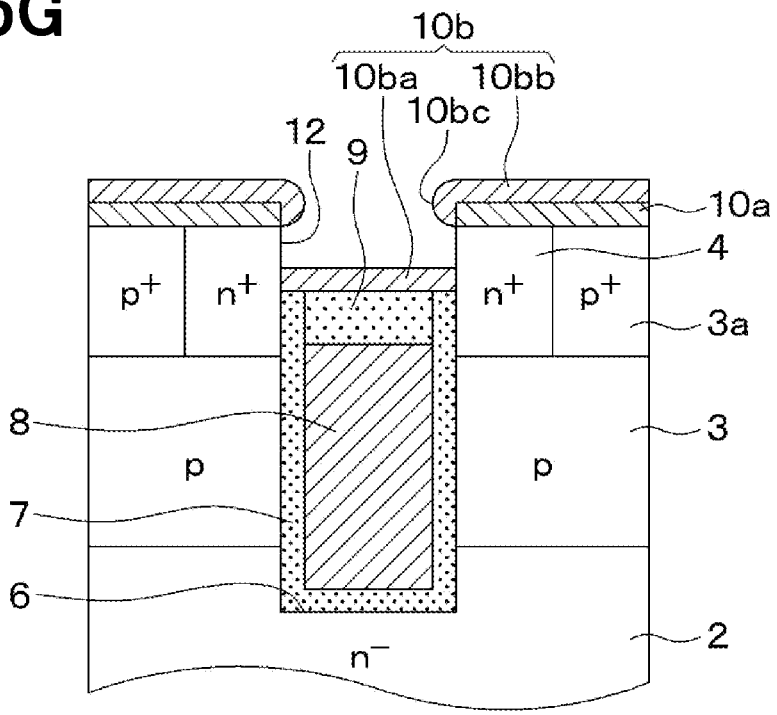
FIG. 5G is a cross-sectional view that illustrates a state after forming a barrier metal in FIG. 4.
Figure 5H:
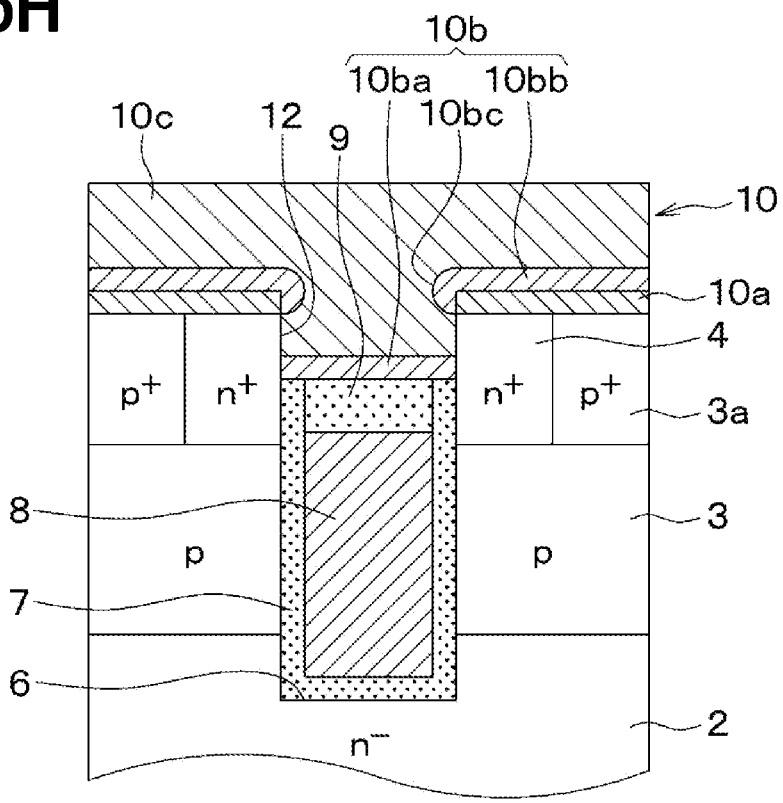
FIG. 5H is a cross-sectional view that illustrates a state after removing a metal film in FIG. 4.

Subsequently, the removal of the metal film 20 is performed as illustrated in FIG. 4 to remove the metal film 20 remained on the interlayer insulation film 9 as in FIG. 5F. For example, the metal film 20 is removed by wet etching. As a result, the metal silicide layer 10a remains only on the SiC surface. Even on the SiC surface, not all of the metal film 20 undergoes the silicidation reaction, and the metal film 20 may remain on the metal silicide layer 10a. In this case, the metal film 20 remained on the metal silicide layer 10a is also removed at the same time. The metal silicide layer 10a is formed by the above thermal treatment, if the temperature of the thermal treatment at this time increased, the metal element included in the metal film 20 may diffuse into the interlayer insulation film 9. For this reason, the above thermal treatment may be held at a relative low temperature of 800 degrees Celsius or lower, it is possible to perform a high-temperature annealing in a range of 900 to 1000 degrees Celsius, for example, 950 degrees Celsius after the removal of the metal film 20. Therefore, it is possible to further reduce the contact resistance between the metal silicide layer 10a and the SiC.

Further, the formation of the barrier metal 10b as shown in FIG. 4 is performed. For example, the barrier metal 10b can be selectively deposited on the metal silicide layer 10a and the interlayer insulation film 9 by sputtering. In this embodiment, the barrier metal 10b is formed by the sputtering of Ti and TiN in order. However, for example, a single-layer film such as Ti or TiN and another type of material may be sputtered to form the barrier metal 10b. As a result, as in FIG. 5G, the barrier metal 10b is formed on the metal silicide layer 10a and the interlayer insulation film 9. The barrier metal 10bb on the metal silicide layer 10a is formed to spread in a lateral direction and wrap around the interior of the gate trench 6, and the protruding portion 10bc is formed in an eaves shape. Since the barrier metal 10b can be more isotropically deposited as the energy during, for example, sputtering is reduced, the size of the protruding portion 10bc can be adjusted by controlling the energy at the time of sputtering.

At this time, since a step is formed between the interlayer insulation film 9 and the metal silicide layer 10a, the step is further inherited by the barrier metal 10b formed on the metal silicide layer 10a and the interlayer insulation film 9. In this embodiment, the depth D1 of the recess 12 is larger than the thickness D2 of the barrier metal 10b. Therefore, the barrier metal 10ba on the interlayer insulating film 9 and the barrier metal 10bb on the metal silicide layer 10a are separately formed. It is possible to form the protruding portion 10bc in a stable eaves shape without forming the barrier metal 10b on the SiC surface of the separating portion.

Subsequently, the formation of the electrode layer 10c as shown in FIG. 4 is performed. For example, AlSi is sputtered. As a result, the electrode layer 10c is formed on the barrier metal 10b as in FIG. 5H. The electrode layer 10c is also formed so as to wrap around the lower portion of the projecting portion 10bc, and a portion of the electrode layer 10c moves into the recess 12. The source electrode 10 is formed by patterning the electrode layer 10c and the barrier metal 10b by using the mask (not shown).

Furthermore, the drain electrode 11 is formed on the back side of the n$^+$-type substrate 1. Thereby, the SiC semiconductor device having the vertical MOSFET according to the present embodiment is completed.

In the SiC semiconductor device according to the present embodiment, a step is formed between the barrier metal 10ba formed at the surface of the interlayer insulation film 9 and the barrier metal 10bb formed on the metal silicide layer 10a. That is, the surface of the base of the electrode layer 10c has surface roughness. The barrier metal 10bb includes the protruding portion 10bc formed in the eaves shape inside the trench and protruding in the width direction of the gate trench 6, so that the dimension W1 is smaller than the dimension W2. A portion of the electrode layer 10c is below the protruding portion 10bc. Therefore, the SiC semiconductor device according to the present embodiment is different from the SiC semiconductor device in a comparative example as described in the following. The electrode layer 10c in this embodiment can exhibit the anchor effect.

Figure 6A:
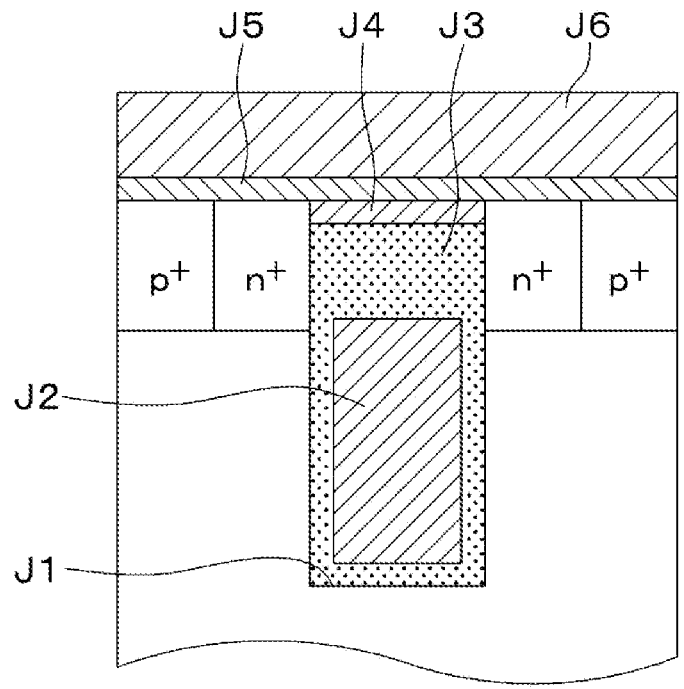
FIG. 6A is a cross-sectional view in a situation where the surface on the gate electrode at the gate trench with the embedded interlayer insulation film and the barrier metal is flattened.
Figure 6B:
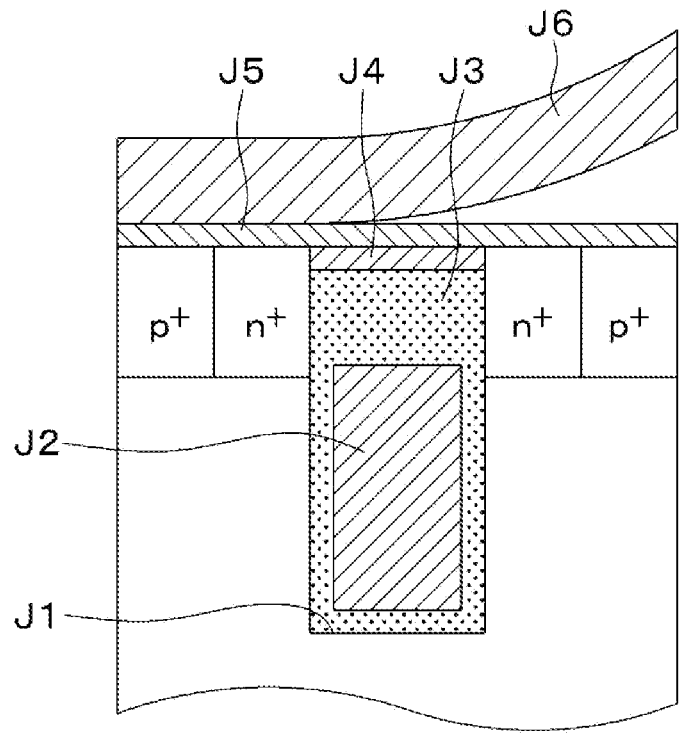
FIG. 6B is a cross-sectional view that illustrates peeling of the source electrode.

In the SiC semiconductor device according to the comparative example, an interlayer insulation film J3 and a barrier metal J4 are embedded on a gate electrode J2 to flatten the surface inside a gate trench J1 as shown in FIG. 6A. A stacking film J5 has the Ni film and the Ti film, and an electrode layer J6 is made of AlSi. When the stacking film J5 and the electrode layer J6 are formed on the barrier metal J4 and the SiC surface, the source electrode including the barrier metal J4, the stacking film J5 and the electrode layer J6 is formed. With such a structure, since a flat surface with smaller roughness is formed by the SiC surface and the barrier metal J4, there is no step taken in by, for example, the electrode layer J6. Therefore, as illustrated in FIG. 6B, for example, the electrode layer J6 is peeled off at the interface with the stacking film J5 so that the source electrode is peeled off.

In contrast, in the SiC semiconductor device according to the present embodiment, the surface of the base of the electrode layer 10c is formed with roughness while a portion of the electrode layer 10c is embedded below the protruding portion 10bc. Therefore, the electrode layer 10c can exhibit an anchor effect. Even if the temperature repeatedly rises and falls when the semiconductor element is operated, the electrode layer 10c is less likely to be peeled off from the underlying barrier metal 10b. Thus, it is possible to inhibit the peeling of the source electrode 10. It is possible to suppress an increase in the temperature caused by an increase in the resistance at the time of applying the current and heat generation, and it is possible to inhibit the breakdown of the element.

Further, in the SiC semiconductor in the present embodiment, the following effects can be obtained.

In the SiC semiconductor device according to the present embodiment, a portion of the electrode layer 10c moves into the recess 12 by forming the electrode layer 10c in a state where the recess 12 remains at the gate trench 6 by making the depth D1 larger than the thickness D2, in other words, in a state where the roughness exists at the SiC surface. Therefore, a portion of the electrode layer 10c penetrates deeper, and a higher anchor effect can be attained. Accordingly, it is possible to further attain the above effects.

The barrier metal 10ba on the interlayer insulation film 9 and the barrier metal 10bb on the SiC surface are not made to be a flat surface, but are made to have a step between the barrier metal 10ba and the barrier metal 10bb. Since the residual stress of the barrier metal 10b can escape, it is possible to manufacture the SiC semiconductor device that suppresses the influence caused by the residual and warping of a wafer.

In the SiC semiconductor device according to the comparative example, since the barrier metal is made of Ti or TiN, the Ni film for forming the metal silicide, and the Ti film are sequentially formed by sputtering, the number of times of sputtering increases. In contrast, in the SiC semiconductor device according to the present embodiment, only the metal film 20 for forming the metal silicide layer 10a and barrier metal 10b are formed by sputtering. Since the sputtering is usually performed by single-wafer processing, the number of times of sputtering leads to an increase in the manufacturing cost of SiC semiconductor devices. As in the SiC semiconductor device according to the present embodiment, if the number of times of sputtering can be decreased, it is possible to simplify the process of manufacturing the SiC semiconductor device and further reduce the manufacturing cost.

Modification of First Embodiment

Figure 7:
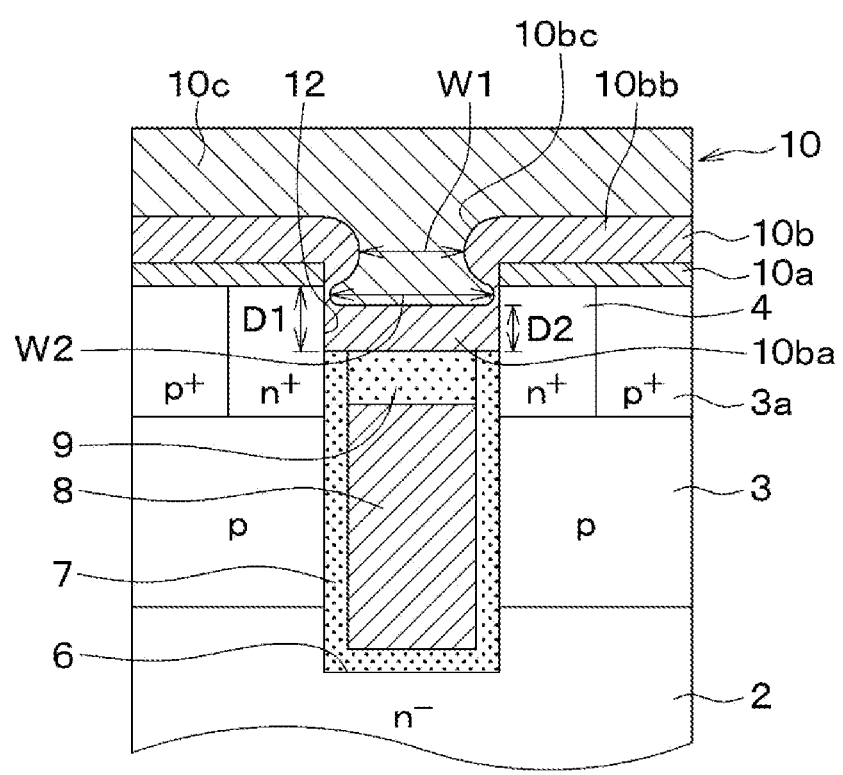
FIG. 7 is a cross-sectional view that illustrates the structure of the source electrode in the SiC semiconductor device in a modified example of the first embodiment.

The first embodiment describes that the barrier metal 10ba and the barrier metal 10bb are separated from each other, they may be connected as shown in FIG. 7. In this situation, since the barrier metal 10b is easily formed on the metal silicide layer 10a as compared with the SiC surface, the protruding portion 10bc is formed at a tip portion of the metal silicide layer 10a.

In the first embodiment, the recess 12 remains recessed even though the barrier metal 10ba is formed. However, the surface of the barrier metal 10ba may be flush with the SiC surface, or the surface of the barrier metal 10ba may protrude from the SiC surface.

In other words, there is a step between the barrier metal 10ba and the barrier metal 10bb, and the protruding portion 10bc is formed at the barrier metal 10bb. As long as the dimension of the distance W1 between the adjacent tips of the protruding portion 10bc is made to be shorter than the dimension of the width W2 of the portion of the electrode layer 10c embedded below the protruding portion 10bc, the same effect as in the first embodiment can be obtained even with such a structure.

Second Embodiment

The following describes a second embodiment. The present embodiment is different from the first embodiment in the formation of the gate wiring portion, and the other parts are the same as in the first embodiment, so only the difference from the first embodiment will be described.

In the present embodiment, the formation of the gate wiring portion connected to the gate electrode 8 at the tip of, for example, the gate-trench structure in the lengthwise direction is described with reference to FIGS. 8, 9A to 9G. FIGS. 9A to 9G are cross-sectional views of respective processes. The left drawing of each of FIGS. 9A to 9G is a cross-sectional view of the vertical MOSFET, and the right drawing of each of FIGS. 9A to 9G is a cross-sectional view of a location other than the vertical MOSFET, for example, a gate wiring portion formed at a connecting region located between a cell region and an outer peripheral high-breakdown structure.

Figure 8:
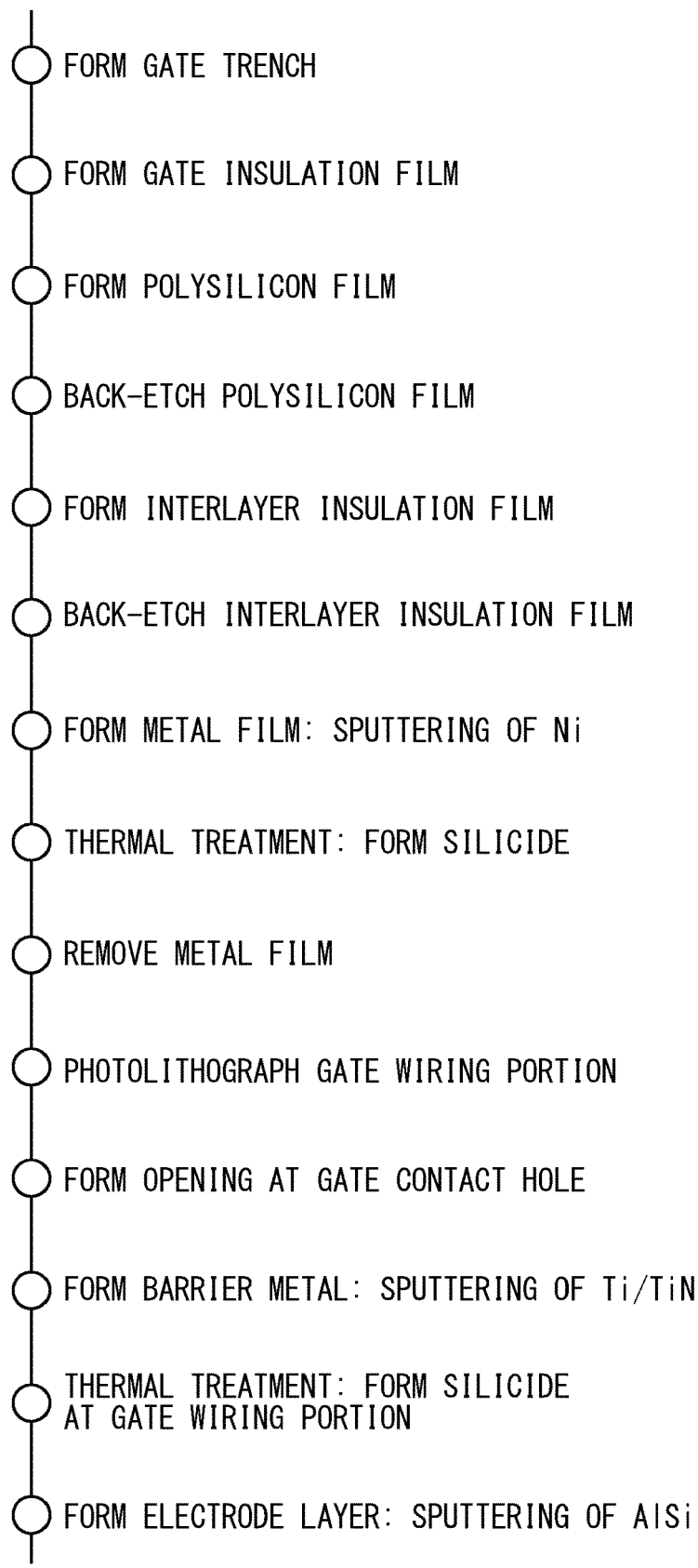
FIG. 8 is a flowchart that illustrates formation of a trench-gate structure and the source electrode in the SiC semiconductor device according to the second embodiment.
Figure 9A:
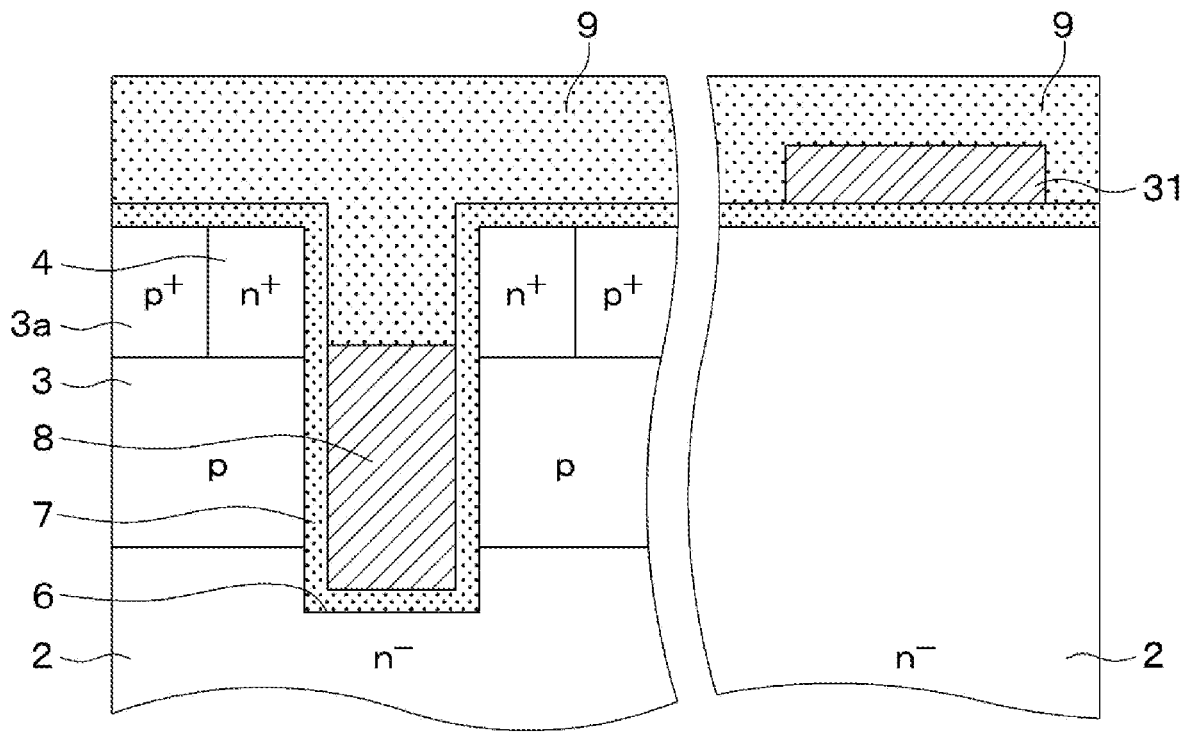
FIG. 9A is a cross-sectional view that illustrates a state after forming an interlayer insulation film in FIG. 8.
Figure 9B:
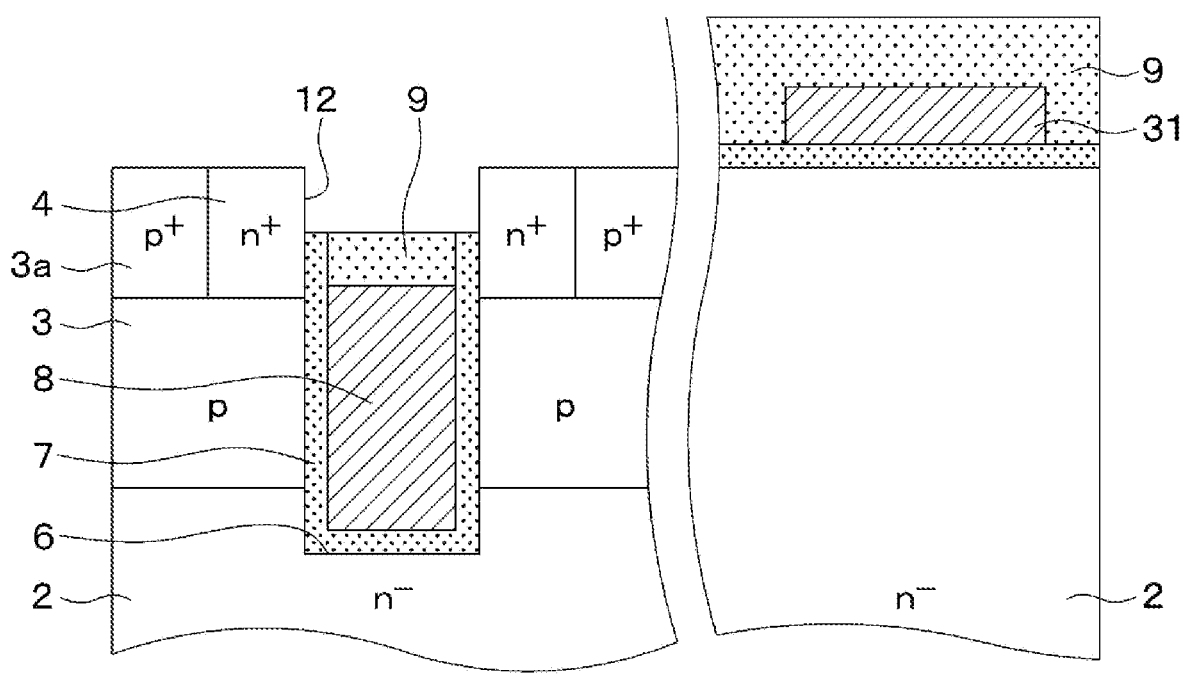
FIG. 9B is a cross-sectional view that illustrates a state after back-etching of the interlayer insulation film in FIG. 8.

The formation of the gate trench 6, the formation of the gate insulation film 7, and the formation of the silicon film shown in FIG. 8 are identical to the first embodiment. At this time, the gate insulation film 7 is formed on the SiC surface and the polysilicon film is also formed on the gate insulation film 7 at a position where the gate wiring portion is formed. Subsequently, the polysilicon film is patterned by back-etching, the gate electrode 8 is formed inside the gate trench 6 as shown in FIG. 9A, and a gate wiring layer 31 included in a portion of the gate wiring portion at another location is formed. In the formation of the interlayer insulation film 9, the interlayer insulation film 9 is formed to be embedded inside the gate trench 6 on the gate electrode 8 and cover the gate wiring layer 31. The back-etching of the interlayer insulation film 9 shown in FIG. 8 is performed. At this time, the cell region formed with the vertical MOSFET has an aperture, and the mask (not shown) covering an area other than the cell region is formed on the interlayer insulation film 9 to perform the back-etching. As in FIG. 9B, the gate wiring layer 31 is covered by the interlayer insulation film 9 while the interlayer insulation film 9 remains only inside the gate trench 6 at the cell region.

Figure 9C:
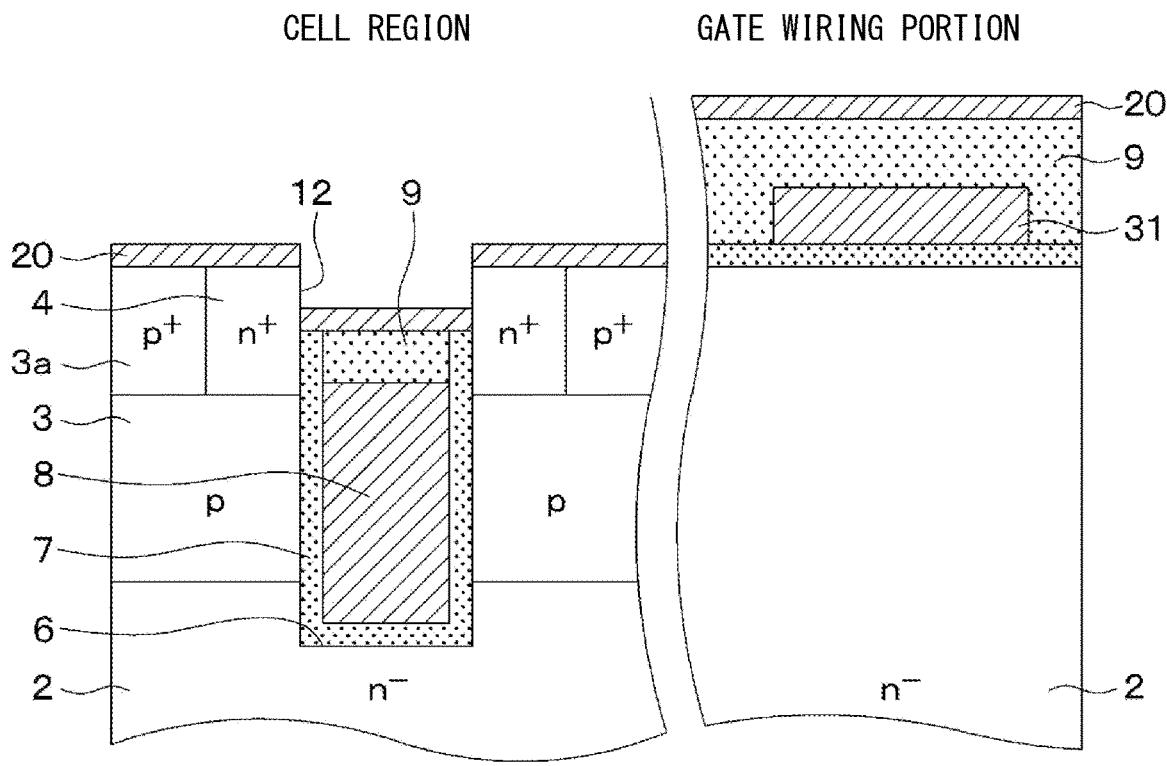
FIG. 9C is a cross-sectional view that illustrates a state after forming a metal film in FIG. 8.
Figure 9D:
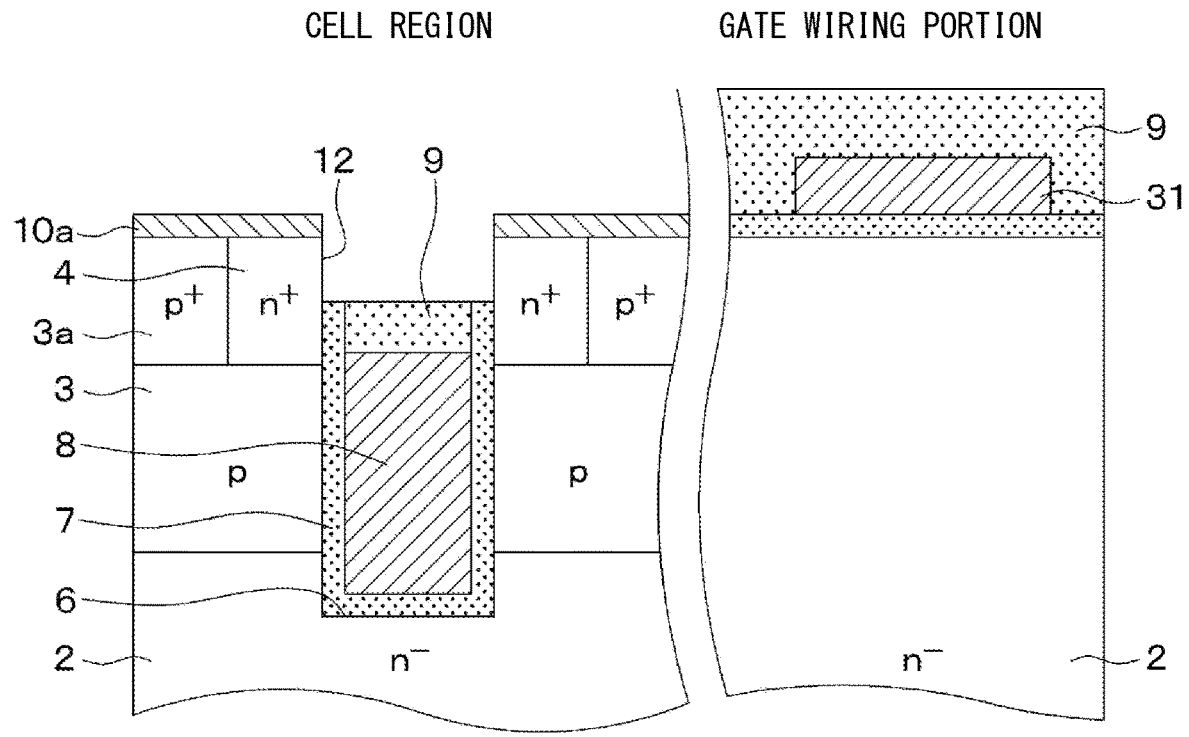
FIG. 9D is a cross-sectional view that illustrates a state after removing a metal film in FIG. 8.
Figure 9E:
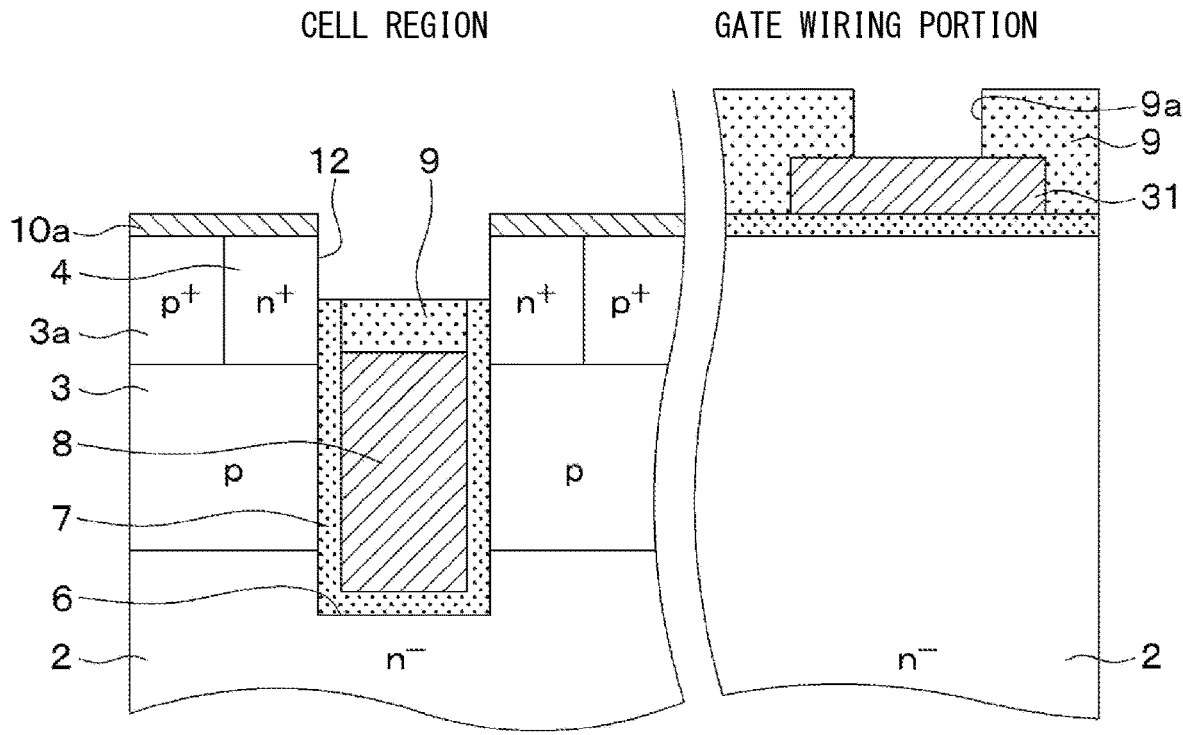
FIG. 9E is a cross-sectional view that illustrates a state after forming a gate contact hole in FIG. 8.
Figure 9F:
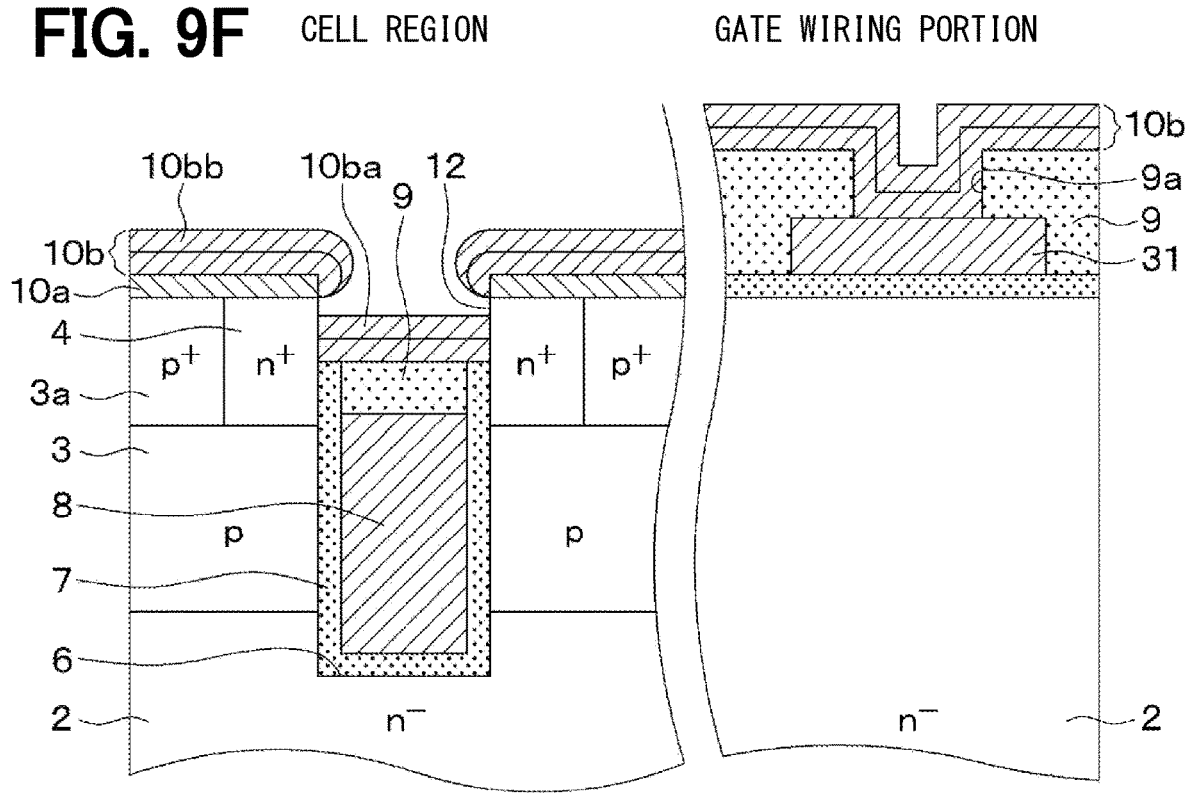
FIG. 9F is a cross-sectional view that illustrates a state after forming a barrier metal in FIG. 8.
Figure 9G:
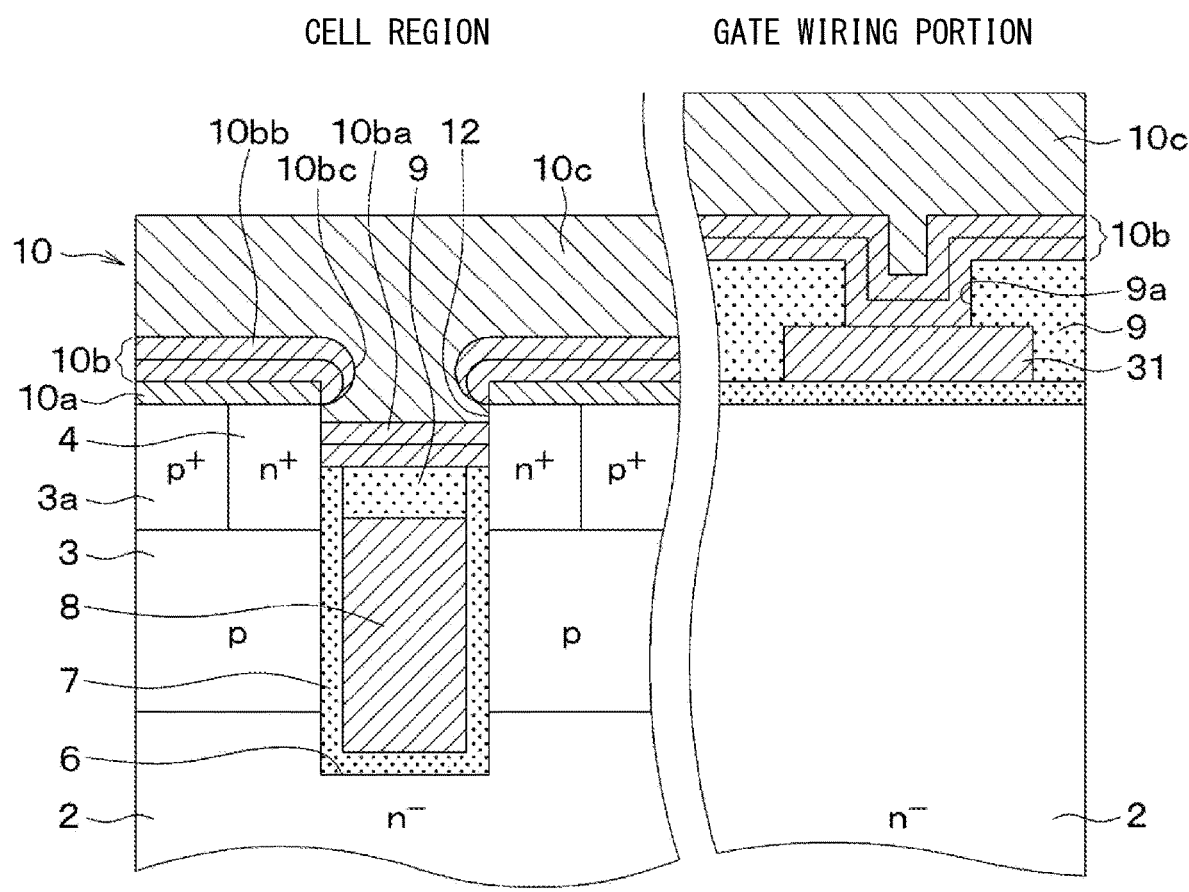
FIG. 9G is a cross-sectional view that illustrates a state after removing an electrode layer in FIG. 8.

Subsequently, the formation of the metal film 20, the formation of the silicide through thermal treatment as shown in FIG. 8 and the removal of the metal film 20 are performed. As a result, the metal film 20 is formed on the SiC surface and the interlayer insulation film 9 and undergoes silicidation as shown in FIG. 9C. After silicidation, the metal film 20 on the interlayer insulation film 9 is removed as in FIG. 9D to form the metal silicide layer 10a on the SiC surface. Since the gate wiring layer 31 is covered by the interlayer insulation film 9, even though the metal film 20 on the interlayer insulation film 9 is removed, the gate wiring layer 31 is still covered by the interlayer insulation film 9.

Subsequently, the photolithography of the gate wiring portion is performed as shown in FIG. 8. In the photolithography process, after the mask (not shown) having an aperture at a position corresponding to the gate wiring layer 31, the etching is performed to form an aperture at the gate contact hole 9a connected to the gate wiring layer 31 at the interlayer insulation film 9 as in FIG. 9E. Further, the formation of the barrier metal 10b as shown in FIG. 8 is performed. For example, the barrier metal 10b is formed by sequentially sputtering Ti and TiN. At this time, as in FIG. 9F, since the gate contact hole 9a is formed, the barrier metal 10b is formed to be in contact with the gate wiring layer 31.

Moreover, if the metal used as the material that undergoes the silicidation reaction, when the thermal treatment as shown in FIG. 8 is performed, the metal silicidation is formed at the contact portion between the gate wiring layer 31 and the barrier metal 10b so that the ohmic contact layer is formed. For example, the thermal treatment is performed in a range of 600 to 800 degrees Celsius, for example, at the temperature of 700 degrees Celsius. As a result, the metal forming the barrier metal 10b and the polysilicon forming the gate wiring layer 31 undergo the silicidation reaction to form the metal silicide layer. As a result, for example, Ti can be used in common for forming the barrier metal 10b and for forming the ohmic contact layer with the gate wiring layer 31.

In addition, TiN can be enhanced in barrier properties by being oxidized or annealed. Therefore, when TiN is used as the barrier metal 10b, it is possible to oxidize the TiN by exposing a sample to atmosphere after forming the TiN film. At the time of oxidation, atmospheric exposure enables oxidation without increasing the process cost. TiN is annealed by performing the thermal treatment described above. It is possible to enhance the barrier properties of TiN.

Subsequently, the formation of the electrode layer 10c as shown in FIG. 8 is performed by sputtering, for example, AlSi. As a result, the electrode layer 10c is formed on the barrier metal 10b as in FIG. 9G. When the electrode layer 10c and the barrier metal 10b are patterned by using the mask (not shown), the source electrode 10 is formed; and the gate wiring portion including the gate wiring layer 31 and the barrier metal 10b and the electrode layer 10c connected to the gate wiring layer 31 is formed.

Finally, the drain electrode 11 is formed on the back side of the n$^+$-type substrate 1. Thereby, the SiC semiconductor device having the vertical MOSFET and the gate wiring portion according to the present embodiment is completed.

As described above, it is possible to form the gate wiring portion by using the barrier metal 10b and the electrode layer 10c at the time of forming the source electrode 10 in the vertical MOSFET. It is possible to obtain the ohmic contact layer by performing the thermal treatment, when the metal for having the silicidation reaction with the barrier metal 10b is used. When the TiN is used for the barrier metal 10b, it is possible to enhance the barrier properties through the atmospheric exposure or the thermal treatment.

OTHER EMBODIMENTS

While the present disclosure has been described in accordance with the embodiments described above, the present disclosure is not limited to the embodiments and includes various modifications and equivalent modifications. In addition, while the various elements are shown in various combinations and configurations, which are exemplary, other combinations and configurations, including more, less or only a single element, are also within the spirit and scope of the present disclosure.

The above embodiments describe the vertical MOSFET with the trench-gate structure. However, other structures may also be provided with the vertical MOSFET as an essential structure. For example, when a p-type deep layer is included below the trench-gate structure, it is possible to provide a variety of structures such as a structure for suppressing the rise of equipotential lines to the trench-gate structure to enhance the breakdown voltage.

Each of the above embodiments describes the structure in which the metal silicide layer 10a is formed as the metal layer on the SiC surface; and the barrier metal 10bb and the electrode layer 10c are disposed in order on the metal silicide layer 10a. However, a metal other than the metal silicide layer 10a may be disposed as the metal layer.

In the above-described embodiment, an n channel-type vertical MOSFET in which the first conductivity type is n-type and the second conductivity type is p-type has been described as an example. Alternatively, the conductivity type of each element may be reversed so as to form a p channel-type vertical MOSFET. In the above description, a vertical MOSFET has been described as an example of a semiconductor element having a trench-gate structure. Alternatively, the present disclosure may be applied to an IGBT having a similar trench-gate structure. In the case of the n-channel type IGBT, the conductivity type of the n$^+$-type substrate 1 is changed from the n-type substrate to the p-type substrate in each of the above embodiments, and the structures and manufacturing methods are the same as those in each of the above embodiments, except that the conductivity type of the n$^+$-type substrate 1 is changed from the n-type substrate to the p-type substrate.

What is claimed is:

1. A silicon carbide semiconductor device comprising:
a semiconductor element including
a substrate made of silicon carbide and being first conductivity type or second conductivity type,
a drift layer being the first conductivity type and disposed on the substrate, the drift layer having lower impurity concentration than the substrate,
a channel layer being the second conductivity type and disposed on the drift layer, the channel layer having a surface layer portion at which a contact region is disposed,
a first-conductivity-type region being the first conductivity type and having higher impurity concentration than the drift layer, the first-conductivity-type region disposed at a position different from the contact region on the channel layer,
a gate-trench structure having a gate trench, a gate insulation film and a gate electrode, the gate trench penetrating the first-conductivity-type region and the channel layer, the gate insulation film disposed at an inner wall surface of the gate trench, the gate electrode disposed on the gate insulation film,
an interlayer insulation film covering the gate electrode inside the gate trench,
a first electrode electrically connected to the contact region and the first-conductivity-type region,
a second electrode disposed at a side closer to a rear surface of the substrate, and
a recess provided by a first step between a top surface of the interlayer insulation film and a top surface of the first-conductivity-type region,
wherein the first electrode includes:
a metal layer disposed on a surface of each of the contact region and the first-conductivity-type region;
a barrier metal disposed on the metal layer and inside the recess; and
an electrode layer disposed on the barrier metal,
wherein the barrier metal includes:
a first barrier metal portion disposed inside the recess; and
a second barrier metal portion disposed on the metal layer,
wherein a second step is provided between the first barrier metal portion and the second barrier metal portion,
wherein the first electrode further includes a protrusion disposed at the second barrier metal portion and protruding toward inside of the gate trench in a width direction of the gate trench,
wherein the protrusion has a first protruding portion and a second protruding portion disposed respectively at both sides of the gate trench in the width direction,
wherein the electrode layer has a portion embedded in the recess below the protrusion, and
wherein a distance between a tip of the first protruding portion and a tip of the second protruding portion in the width direction of the gate trench is smaller than a width of the portion of the electrode layer below the protrusion in the width direction of the gate trench, and wherein the electrode layer is not in direct contact with the interlayer insulation film.

2. The silicon carbide semiconductor device according to claim 1,
wherein the metal layer is a metal silicide layer.

3. The silicon carbide semiconductor device according to claim 1,
wherein the first barrier metal portion and the second barrier metal portion are separated from each other, and
wherein a depth of the recess is larger than a thickness of the first barrier metal portion.

4. The silicon carbide semiconductor device according to claim 1,
wherein the first barrier metal portion and the second barrier metal portion are connected,
wherein the protrusion is disposed at an end portion of the metal layer, and
wherein the distance between the tip of the first protruding portion and the tip of the second protruding portion in the width direction of the gate trench is smaller than the width of the portion of the electrode layer below the protrusion in the width direction of the gate trench.

5. The silicon carbide semiconductor device according to claim 1,
wherein the barrier metal is made of one of titanium and titanium nitride, or is made of a stacking structure having both of titanium and titanium nitride.

6. The silicon carbide semiconductor device according to claim 1,
wherein the first barrier metal portion is not connected to the second barrier metal portion.

7. The silicon carbide semiconductor device according to claim 1,
wherein the first barrier metal portion is not connected to the protrusion.

8. The silicon carbide semiconductor device according to claim 1,
wherein the protrusion protrudes in an eaves shape.

9. A silicon carbide semiconductor device comprising:
a semiconductor element including
a substrate made of silicon carbide and being first conductivity type or second conductivity type,
a drift layer being the first conductivity type and disposed on the substrate, the drift layer having lower impurity concentration than the substrate,
a channel layer being the second conductivity type and disposed on the drift layer, the channel layer having a surface layer portion at which a contact region is disposed,
a first-conductivity-type region being the first conductivity type and having higher impurity concentration than the drift layer, the first-conductivity-type region disposed at a position different from the contact region on the channel layer,
a gate-trench structure having a gate trench, a gate insulation film and a gate electrode, the gate trench penetrating the first-conductivity-type region and the channel layer, the gate insulation film disposed at an inner wall surface of the gate trench, the gate electrode disposed on the gate insulation film,
an interlayer insulation film covering the gate electrode inside the gate trench, a first electrode electrically connected to the contact region and the first-conductivity-type region, a second electrode disposed at a side closer to a rear surface of the substrate, and a recess provided by a first step between a top surface of the interlayer insulation film and a top surface of the first-conductivity-type region, wherein the first electrode includes:

a metal layer disposed on a surface of each of the contact region and the first-conductivity-type region;

a barrier metal disposed on the metal layer and inside the recess; and an electrode layer disposed on the barrier metal, wherein the barrier metal includes:

a first barrier metal portion disposed inside the recess; and a second barrier metal portion disposed on the metal layer, wherein a second step is provided between the first barrier metal portion and the second barrier metal portion, wherein the first electrode further includes a protrusion disposed at the second barrier metal portion and protruding toward inside of the gate trench in a width direction of the gate trench, wherein the protrusion has a first protruding portion and a second protruding portion disposed respectively at both sides of the gate trench in the width direction, wherein the electrode layer has a portion embedded in the recess below the protrusion, and wherein a distance between a tip of the first protruding portion and a tip of the second protruding portion in the width direction of the gate trench is smaller than a width of the portion of the electrode layer embedded in the recess below the protrusion in the width direction of the gate trench.

10. The silicon carbide semiconductor device according to claim 9, wherein the metal layer is a metal silicide layer.

11. The silicon carbide semiconductor device according to claim 9, wherein the first barrier metal portion and the second barrier metal portion are separated from each other, and wherein a depth of the recess is larger than a thickness of the first barrier metal portion.

12. The silicon carbide semiconductor device according to claim 9, wherein the first barrier metal portion and the second barrier metal portion are connected, wherein the protrusion is disposed at an end portion of the metal layer, and wherein the distance between the tip of the first protruding portion and the tip of the second protruding portion in the width direction of the gate trench is smaller than the width of the portion of the electrode layer below the protrusion in the width direction of the gate trench.

13. The silicon carbide semiconductor device according to claim 9, wherein the barrier metal is made of one of titanium and titanium nitride, or is made of a stacking structure having both of titanium and titanium nitride.

14. The silicon carbide semiconductor device according to claim 9, wherein the first barrier metal portion is not connected to the second barrier metal portion.

15. The silicon carbide semiconductor device according to claim 9, wherein the first barrier metal portion is not connected to the protrusion.

16. The silicon carbide semiconductor device according to claim 9, wherein the protrusion protrudes in an eaves shape.

17. The silicon carbide semiconductor device according to claim 9, wherein the electrode layer is not in direct contact with the interlayer insulation film.

\* \* \* \* \*